US009799600B1

(12) United States Patent
Cheng et al.

(10) Patent No.: US 9,799,600 B1
(45) Date of Patent: Oct. 24, 2017

(54) NICKEL-SILICON FUSE FOR FINFET STRUCTURES

(71) Applicant: INTERNATIONAL BUSINESS MACHINES CORPORATION, Armonk, NY (US)

(72) Inventors: Kangguo Cheng, Schenectady, NY (US); Keith E. Fogel, Hopewell Junction, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/271,698

(22) Filed: Sep. 21, 2016

(51) Int. Cl.
H01L 21/02 (2006.01)
H01L 23/525 (2006.01)
H01L 29/66 (2006.01)
H01L 29/78 (2006.01)
H01L 23/532 (2006.01)

(52) U.S. Cl.
CPC .... *H01L 23/5256* (2013.01); *H01L 23/53209* (2013.01); *H01L 29/66545* (2013.01); *H01L 29/66795* (2013.01); *H01L 29/785* (2013.01)

(58) Field of Classification Search
CPC ........... H01L 23/5256; H01L 23/53209; H01L 21/02; H01L 21/02603; H01L 21/28; H01L 21/3213; H01L 21/32133; H01L 21/28008; H01L 21/32139; H01L 21/027; H01L 21/0274
USPC ........................................................ 438/199
See application file for complete search history.

(56) References Cited

U.S. PATENT DOCUMENTS

| | | | |
|---|---|---|---|
| 8,816,327 B2 | 8/2014 | Chang et al. | |
| 8,957,482 B2 | 2/2015 | Hsueh et al. | |
| 2007/0029576 A1 | 2/2007 | Nowak et al. | |
| 2010/0059823 A1 | 3/2010 | Chung et al. | |
| 2013/0065371 A1* | 3/2013 | Wei ................... | H01L 21/76224 438/294 |
| 2014/0353790 A1 | 12/2014 | Park et al. | |

\* cited by examiner

*Primary Examiner* — Chuong A Luu
(74) *Attorney, Agent, or Firm* — Tutunjian & Bitetto, P.C.; Vazken Alexanian

(57) ABSTRACT

Semiconductor fuses and methods of forming the same include forming a dummy gate on a semiconductor fin. A dielectric layer is formed around the dummy gate. The dummy gate is removed to expose a region of the semiconductor fin. The exposed region is metallized.

13 Claims, 5 Drawing Sheets

NICKEL-SILICON FUSE FOR FINFET STRUCTURES

BACKGROUND

Technical Field

The present invention generally relates to semiconductor devices and, more particularly, to nickel-silicon fuses formed with fin field effect transistor (FinFET) processes.

Description of the Related Art

Fin field effect transistor (FinFET) devices are prevalent in modern circuit designs. Their advantageous electronic characteristics and small layout area make them suitable for many different applications. However, full circuit designs often make use of other structures, such as capacitors and fuses, to perform certain functions.

SUMMARY

A method of forming a semiconductor device includes forming a dummy gate on a semiconductor fin. A dielectric layer is formed around the dummy gate. The dummy gate is removed to expose a region of the semiconductor fin. The exposed region is metallized.

A method of forming a semiconductor device includes forming a dummy gate on a semiconductor fin. A spacer is formed around the dummy gate. Doped fin extensions are epitaxially grown on regions of the semiconductor fin not covered by the dummy gate or the spacer. A first dielectric layer is formed around the dummy gate and over the fin extensions. The dummy gate is removed to expose a region of the semiconductor fin. A silicide is formed in the exposed region, such that the semiconductor fin has a fully conductive cross-section in the exposed region. A second dielectric layer is formed over the exposed region.

A fuse includes a semiconductor fin comprising a metallized region between two non-metallized regions. Conductive layers are formed on the semiconductor fin above the two non-metallized regions. A passivating dielectric layer is formed over and around the metallized region, between the conductive layers.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide electronically programmable fuses based on a fin field effect transistor (FinFET) fabrication process. The integration of fuse fabrication with standard FinFET processes makes it easier to implement these devices on the same chip as FinFETs, reducing the number of steps needed to fabricate the entire chip and thereby reducing the cost to make the finished product. Toward that end, the present embodiments form a semiconductor fin, form a source and drain outside of a dummy gate, remove the dummy gate, and silicide the portion of the fin that would represent the channel in a conventional FinFET.

Such silicide fins form the programmable fuse. In particular, the electromigration effect is used to cause the conductive silicide material to move and separate. Under a sufficiently high current density, the material of the silicide fin will partially or fully break, thereby significantly changing the resistance of the device. Thus the logical state of the fuse (i.e., whether the fuse is whole or tripped) can be set by applying an appropriately high voltage and read by applying a lower voltage and determining its resistance.

In general, electromigration is described by the mean time to failure, which can be characterized as:

$$MTTF = \frac{A}{J^n} e^{\frac{E_a}{kT}}$$

where A is the cross sectional area of the fin, J is the current density, $E_\alpha$ is the activation energy, k is Boltzmann's constant, T is the temperature in Kelvin, and n is a scaling factor. Thus, the amount of time for the device to fail (i.e., for the fuse to be programmed by causing a break in the conductive material of the silicide fin) decreases as the current density increases and as the cross-sectional area decreases. As a result, a lower cross-sectional area means that a correspondingly lower current density is needed, making FinFET fuses particularly useful in situations where a fuse needs to be programmed quickly or with little energy expenditure.

Figure 1:
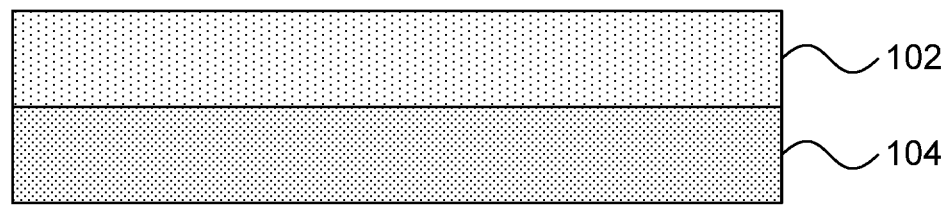
FIG. 1 is a cross-sectional view of a step in the formation of a semiconductor fuse in accordance with the present embodiments.

Referring now to the drawings in which like numerals represent the same or similar elements and initially to FIG. 1, a cross-sectional view of a step in the formation of a FinFET-based fuse is shown. A semiconductor fin 102 is provided and is shown in lengthwise in this figure. The semiconductor fin 102 may formed from a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide.

In some embodiments, the semiconductor fin 102 may be formed from a semiconductor-on-insulator substrate with a buried insulator layer 104 underneath a semiconductor layer. It is specifically contemplated that the buried insulator layer 104 may be, e.g., a silicon dioxide layer, but it should be understood that any appropriate insulating or dielectric material may be used instead. In other embodiments, the insulator layer 104 may be formed on a lower bulk semiconductor substrate.

The semiconductor fin 102 may itself be formed by any appropriate lithographic process including, e.g., a photolithographic mask and etch. In one specific embodiment, a layer of semiconductor material is deposited on the buried insulator layer 104. A pattern is produced by applying a photoresist to the surface of the deposited semiconductor material. The photoresist is exposed to a pattern of radiation that causes a chemical reaction within the photoresist. The pattern is then developed into the photoresist utilizing a resist developer. Once the patterning of the photoresist is completed, the sections covered by the photoresist are protected while the exposed regions are removed using a selective etching process that removes the unprotected regions. The photoresist may also be removed after patterning is complete. In one embodiment, a hardmask may be used to form the semiconductor fin 102. The mask may be formed by first depositing a dielectric hardmask material, like silicon nitride or silicon dioxide atop a layer of semiconductor layer and then applying a photoresist pattern to the hardmask material using a lithography process. The photoresist pattern is then transferred into the hardmask material using a dry etch process. Next the photoresist pattern is removed and the pattern is transferred into the semiconductor material during a selective etching process, such as reactive ion etching (RIE). The remaining mask material may be removed by a wet or dry etch.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. Alternatively, the semiconductor fin 102 can be formed by other patterning techniques such as spacer image transfer.

Figure 2:
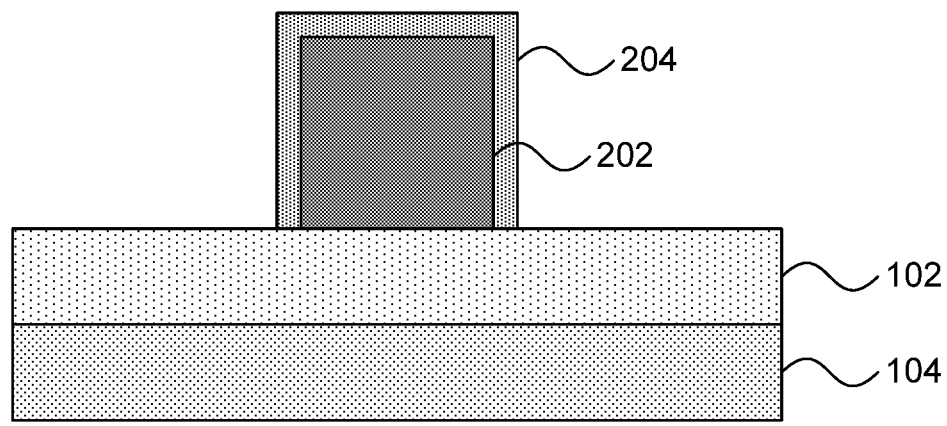
FIG. 2 is a cross-sectional view of a step in the formation of a semiconductor fuse in accordance with the present embodiments.

Referring now to FIG. 2, a cross-sectional view of a step in the formation of a FinFET-based fuse is shown. A dummy gate 202 is formed on and around the semiconductor fin 102. The semiconductor fin 102 has a thin oxide layer around it to separate it from the dummy gate 202 and to enable later removal. It is specifically contemplated that the dummy gate 202 may be formed from a semiconductor material such as polysilicon, but any appropriate, patternable material may be used instead. A layer of dummy gate material is deposited on the semiconductor fin 102 and subsequently patterned with, e.g., photolithographic processes to create the dummy gate structure. The hardmask used to pattern the dummy gate 202 may be left intact after patterning.

After formation of the dummy gate 202, a spacer 204 is formed conformally on the dummy gate 202. It is specifically contemplated that the spacer 204 may be formed from silicon nitride, but it should be understood that any appropriate insulating, dielectric, or hardmask material may be used instead. The spacer 204 may be formed in some embodiments by conformally depositing spacer material on the semiconductor fin 102 and then anisotropically etching the material to remove the deposited dielectric from horizontal surfaces. The remaining vertical dielectric material and the remaining hardmask from dummy gate formation form the spacer 204.

Figure 3:
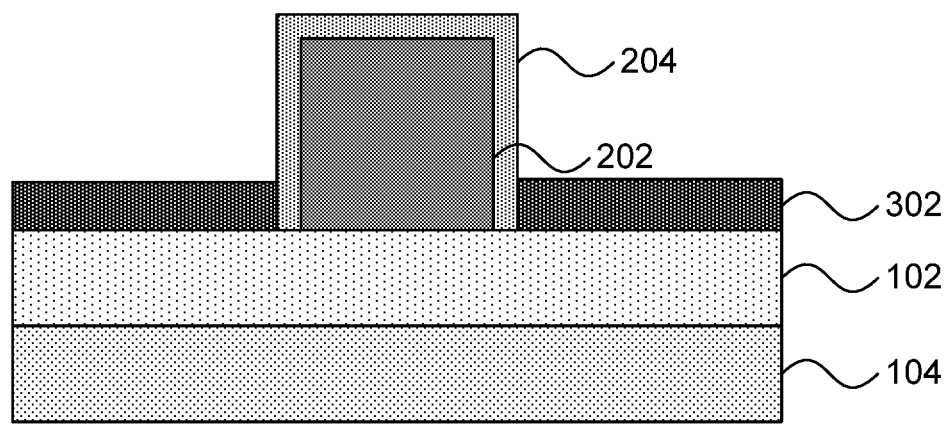
FIG. 3 is a cross-sectional view of a step in the formation of a semiconductor fuse in accordance with the present embodiments.

Referring now to FIG. 3, a cross-sectional view of a step in the formation of a FinFET-based fuse is shown. Conductive regions 302 are formed on the semiconductor fin 102. In one specific embodiment, it is contemplated that the conductive regions 302 may be formed from a doped semiconductor. The conductive regions 302 match the source and drain regions of conventional FinFETs and may be formed by the same processes. In particular, it is contemplated that the conductive regions 302 may be epitaxially grown from the portions of the semiconductor fin 102 that are not covered by the dummy gate 202.

The conductive regions 302 may be in situ doped during epitaxial growth or, alternatively, may be doped by implantation or any other appropriate process for adding dopant to the material. The dopant may be either a p-type dopant or an n-type dopant. As used herein, "p-type" refers to the addition of impurities to an intrinsic semiconductor that creates deficiencies of valence electrons. In a silicon-containing material, examples of p-type dopants, i.e., impurities, include but are not limited to: boron, aluminum, gallium and indium. As used herein, "n-type" refers to the addition of impurities that contributs free electrons to an intrinsic semiconductor in a silicon containing substrate examples of n-type dopants, i.e., impurities, include but are not limited to antimony, arsenic and phosphorous. Specifically contemplated embodiments include conductive regions 302 that are formed from silicon with a phosphorous dopant or silicon germanium (with a germanium content of between about 20% and about 60%) with a boron dopant, but it should be understood that any appropriate combination of semiconductor material and dopant may be used instead. A dopant concentration range of about $4\times10^{10}/cm^3$ to about $2\times10^{21}/cm^3$ may be used.

Figure 4:
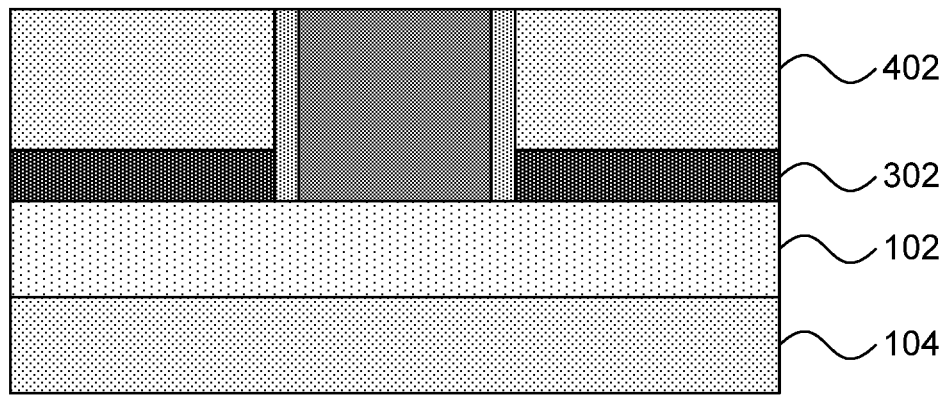
FIG. 4 is a cross-sectional view of a step in the formation of a semiconductor fuse in accordance with the present embodiments.

Referring now to FIG. 4, a cross-sectional view of a step in the formation of a FinFET-based fuse is shown. An inter-layer dielectric 402 is deposited over and around the gate 202, conductive regions 302, and semiconductor fins 102 and polished down to the level of the gate 202. It is specifically contemplated that the inter-layer dielectric 402 may be formed from silicon dioxide, but it should be understood that any appropriate dielectric or insulating material may be used instead.

The inter-layer dielectric 402 may be formed by any appropriate process including, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

After formation, the inter-layer dielectric 402 is polished down using, e.g., chemical mechanical planarization (CMP). CMP is performed using, e.g., a chemical or granular slurry and mechanical force to gradually remove upper layers of the device. The slurry may be formulated to be unable to dissolve, for example, the dummy gate material, resulting in the CMP process's inability to proceed any farther than that layer.

Figure 5:
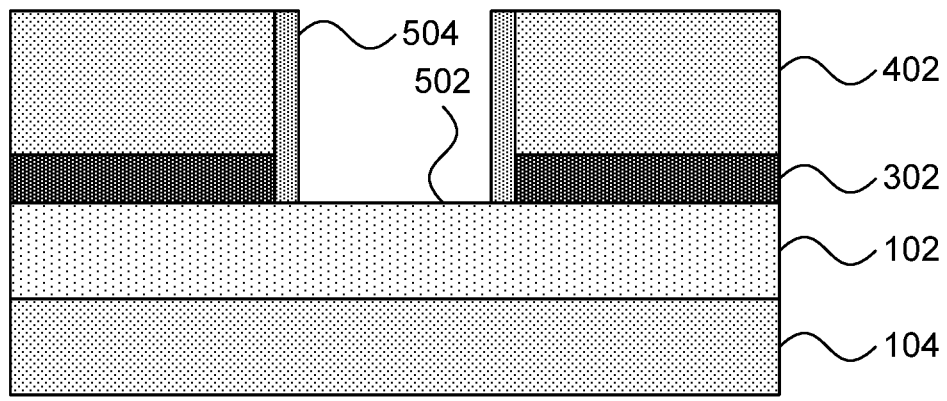
FIG. 5 is a cross-sectional view of a step in the formation of a semiconductor fuse in accordance with the present embodiments.

Referring now to FIG. 5, a cross-sectional view of a step in the formation of a FinFET-based fuse is shown. The dummy gate 202 is removed, exposing the underlying region 502 of the semiconductor fin 102. The vertical portion of the spacer 204 remains as sidewalls 504, defining the edges of the exposed region 502. The dummy gate 202 may be removed by any appropriate wet or dry etch that selectively removes the dummy gate material while leaving the vertical sidewalls 504, the inter-layer dielectric 402, and the semiconductor fin 102 unharmed.

Figure 6:
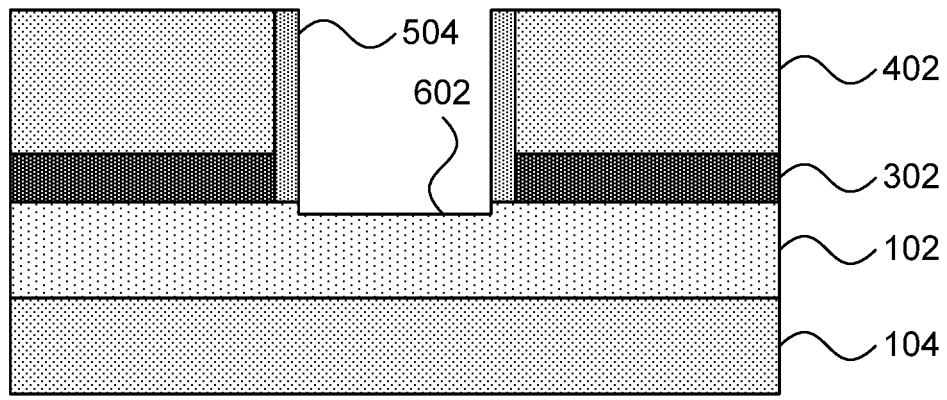
FIG. 6 is a cross-sectional view of a step in the formation of a semiconductor fuse in accordance with the present embodiments.

Referring now to FIG. 6, a cross-sectional view of an optional step in the formation of a FinFET-based fuse is shown. In this embodiment, the height of the exposed portion of the semiconductor fin 102 may be trimmed using any appropriate etch such as, e.g., a wet oxide etch, a thermal oxide etch, or a hydrochloric acid etch. The trimmed region 602 has a smaller cross sectional area than the untrimmed fin, such that the amount of current needed to break the fuse will be smaller. In this fashion, the fuse can be precisely fabricated with desired fuse properties, in particular by providing a cross-sectional area that would be difficult or impossible to create with lithographic processes alone or with fin heights that are substantially different than those used for other fin-based devices on the same chip.

In one specific example, with a lithographic process that provides fins that are about 8 nm wide, followed by a silicide process that causes the volume of the fins by a factor of about 2.1×, the final fuse may have a width of about 16 nm. Trimming the silicon fins to values below 8 nm will proportionally decrease the final fuse size.

Figure 7:
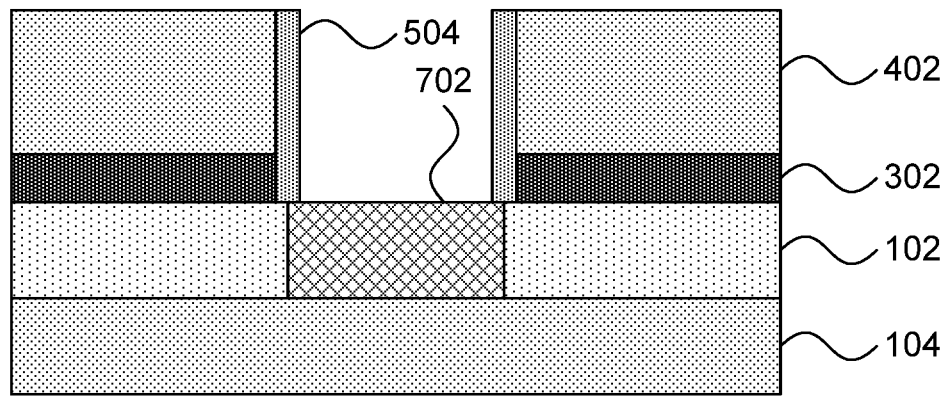
FIG. 7 is a cross-sectional view of a step in the formation of a semiconductor fuse in accordance with the present embodiments.

Referring now to FIG. 7, a cross-sectional view of a step in the formation of a FinFET-based fuse is shown. A metallized region 702 is formed on the exposed portion 502 of the semiconductor fin 102. It is specifically contemplated that the metallized region 702 may be formed as a silicide—an alloy of metal and silicon—but it should be understood that the metallized region may alternatively be formed using any appropriate semiconductor material such as, e.g., germanium (germanicide) or silicon germanium. In one specific embodiment, the metallized region 702 may be formed as an alloy of nickel and silicon, though other metals, such as titanium or platinum, are contemplated as well.

Silicide formation typically involves the deposition of a refractory metal such as nickel or titanium by any appropriate deposition process onto the surface of a semiconductor material. Following deposition, the structure is then subjected to an annealing step using conventional processes such as, but not limited to, rapid thermal annealing. In one specific embodiment, the silicidation anneal may be performed at about 420° C. for about 5 minutes, with a temperature range between about 400° C. and about 450° C. for a time period of about 5 minute to about 10 minutes also being contemplated. During thermal annealing, the deposited metal reacts with the semiconductor, forming a metal silicide. In addition, there will be some lateral diffusion of the metal underneath the sidewalls 504, which brings the metallized region 702 close to, or into contact with, the conductive regions 302, forming an electrical connection between the regions. It is specifically contemplated that the metallized region 702 will have a fully silicide cross section, such that every part of the cross section is conductive and undergoes electromigration.

Figure 8:
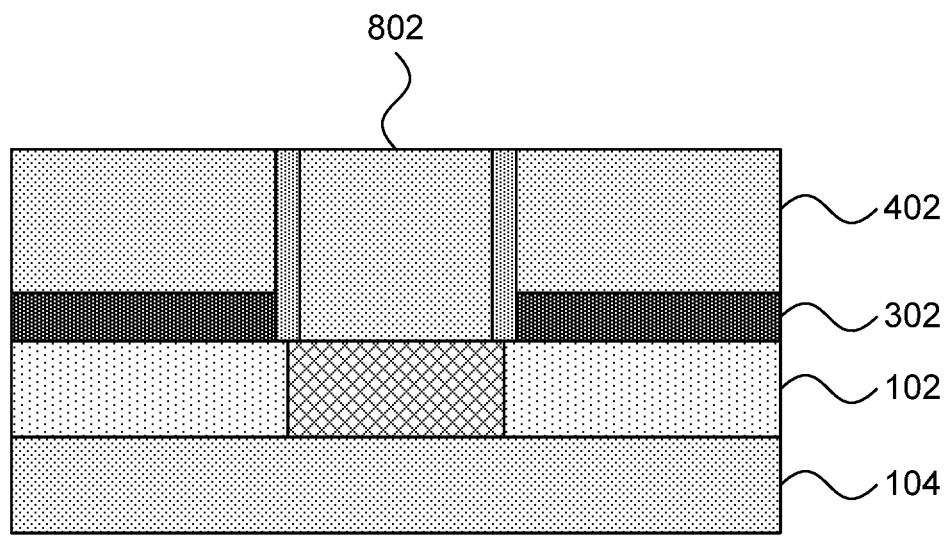
FIG. 8 is a cross-sectional view of a step in the formation of a semiconductor fuse in accordance with the present embodiments.

Referring now to FIG. 8, a cross-sectional view of a step in the formation of a FinFET-based fuse is shown. A passivating insulator or dielectric 802 is deposited over the metallized region 702. The passivating layer 802 may be formed from, e.g., silicon dioxide or any other appropriate material using, for example, CVD, ALD, PVD, or any other suitable deposition process. The passivating material may then be polished down to the level of the vertical sidewalls 502 using, e.g., CMP.

Figure 9:
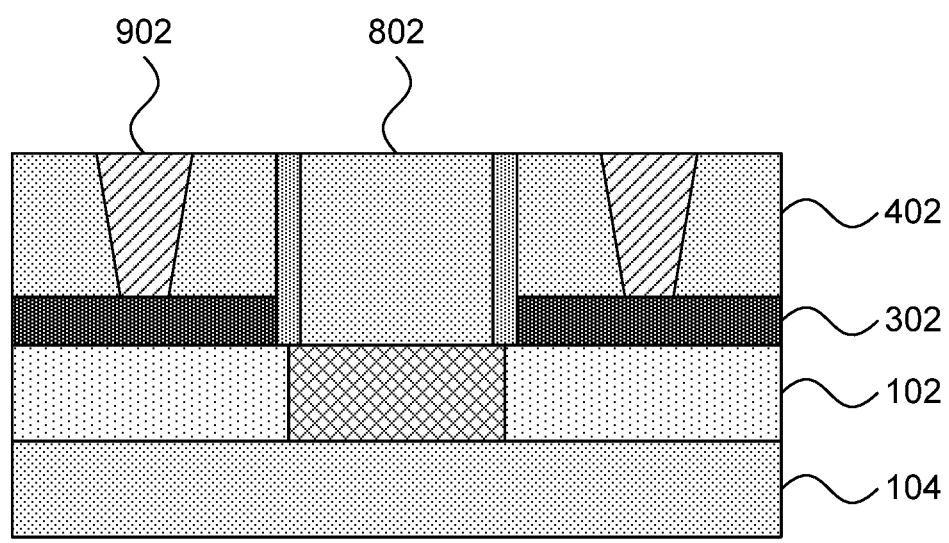
FIG. 9 is a cross-sectional view of a step in the formation of a semiconductor fuse in accordance with the present embodiments.

Referring now to FIG. 9, a cross-sectional view of a step in the formation of a FinFET-based fuse is shown. Conductive contacts 902 are formed by forming holes in the inter-layer dielectric 402 using an anisotropic etch, such as RIE, and depositing a suitable conductive material therein. It is specifically contemplated that the conductive contacts 902 may be formed from a metal such as, e.g., copper, nickel, titanium, gold, silver, aluminum, platinum, or alloys thereof. A CMP process removes any excess conductive material. This completes the fuse structure. It is specifically contemplated that each fuse will have a single respective fin, to decrease the likelihood of ambiguous or incomplete fuse breakage, but it should be understood that multiple fins may be used in a single fuse with merged contacts.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 10:
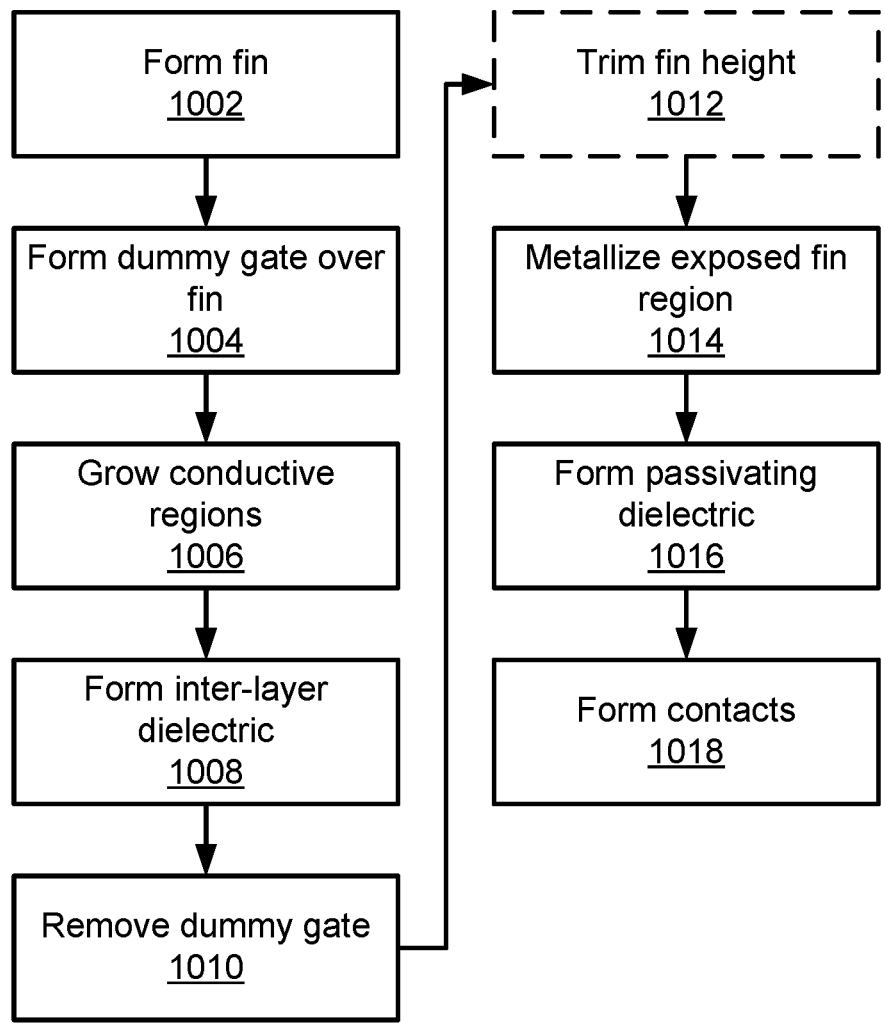
FIG. 10 is a block/flow diagram of a method of forming a semiconductor fuse in accordance with the present embodiments.

Referring now to FIG. 10, a method of forming a FinFET-based fuse is shown. Block 1002 forms a fin 102 from, e.g., a semiconductor substrate using any appropriate fabrication technique, such as photolithography and sidewall image transfer. Block 1004 forms a dummy gate 202 over the semiconductor fin 102 with an accompanying spacer 204.

Block 1006 grows the conductive regions 302 epitaxially on the fins 102. It is specifically contemplated that the conductive regions 302 may be formed from a doped semiconductor material such as, e.g., phosphorous-doped silicon or boron-doped silicon germanium. Block 1008 forms an inter-layer dielectric 402 over the conductive regions 302 that may be formed from any appropriate dielectric material such as, e.g., silicon dioxide. Block 1008 deposits the dielectric material and then polishes the layer down to the level of the dummy gate 202.

Block 1010 removes the dummy gate 202 using any appropriate etch to expose the underlying region 502 of the semiconductor fin 102. Block 1012 optionally trims the height of the semiconductor fin 102 to adjust the properties of the fuse. Block 1014 then metallizes the exposed fin region 502 by, e.g., depositing a metal such as nickel and annealing the exposed fin region 502 to form metallized region 702.

Block 1016 forms a passivating dielectric over the metallized region 702 from, e.g., silicon dioxide. Block 1018 forms holes within the inter-layer dielectric 402 that reach down to the conductive regions 302 and then forms conductive contacts 902 in the holes to complete the fuse.

Having described preferred embodiments of a nickel-silicon fuse for FinFET structures (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method of forming a semiconductor device, comprising:
   forming a dummy gate on a semiconductor fin;
   forming a dielectric layer around the dummy gate;
   removing the dummy gate to expose a region of the semiconductor fin; and
   metallizing the exposed region.

2. The method of claim 1, further comprising forming conductive regions on regions of the semiconductor fin not covered by the dummy gate before forming the dielectric layer.

3. The method of claim 2, wherein forming the conductive regions comprises epitaxially growing doped fin extensions.

4. The method of claim 2, further comprising forming conductive contacts through the dielectric layer in contact with the conductive regions.

5. The method of claim 1, further comprising trimming a height of the exposed region before metallizing the exposed region.

6. The method of claim 1, wherein metallizing the exposed region comprises:
   depositing a metal layer over the semiconductor fin in the exposed region; and
   annealing the semiconductor fin to cause metal from the metal layer to react with the semiconductor fin in the exposed region.

7. The method of claim 6, wherein annealing the semiconductor fin further causes metal from the metal layer to react with all of the material in the semiconductor fin in the exposed region, such that the semiconductor fin has a fully conductive cross-section in the exposed region.

8. The method of claim 6, wherein annealing the semiconductor fin further causes metal from the metal layer to react with material under a vertical sidewall spacer to contact conductive regions on the semiconductor fin.

9. The method of claim 1, further comprising forming a passivating dielectric layer over the metallized region.

10. The method of claim 1, further comprising forming a spacer around the dummy gate before forming the dielectric layer.

11. A method of forming a semiconductor device, comprising:
    forming a dummy gate on a semiconductor fin;
    forming a spacer around the dummy gate;
    epitaxially growing doped fin extensions on regions of the semiconductor fin not covered by the dummy gate or the spacer;
    forming a first dielectric layer around the dummy gate and over the fin extensions;
    removing the dummy gate to expose a region of the semiconductor fin;
    forming a silicide in the exposed region, such that the semiconductor fin has a fully conductive cross-section in the exposed region; and
    forming a second dielectric layer over the exposed region.

12. The method of claim 11, further comprising trimming a height of the exposed region before forming the silicide.

13. The method of claim 11, further comprising forming conductive contacts through the first dielectric layer in contact with the conductive regions.

* * * * *